(12) United States Patent
Chia

(10) Patent No.: US 12,520,504 B2
(45) Date of Patent: Jan. 6, 2026

(54) SEMICONDUCTOR DEVICE WITH STACKED MEMORY PERIPHERY AND ARRAY AND METHOD FOR FORMING THE SAME

(71) Applicant: Taiwan Semiconductor Manufacturing Company, Ltd., Hsinchu (TW)

(72) Inventor: Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 438 days.

(21) Appl. No.: 18/178,371

(22) Filed: Mar. 3, 2023

(65) Prior Publication Data

US 2024/0138156 A1 Apr. 25, 2024

Related U.S. Application Data

(60) Provisional application No. 63/419,074, filed on Oct. 25, 2022.

(51) Int. Cl.
*H01L 23/48* (2006.01)
*H10B 80/00* (2023.01)

(52) U.S. Cl.
CPC .................. *H10B 80/00* (2023.02)

(58) Field of Classification Search
CPC .............................. H10B 80/00; H10B 10/125
USPC ........................................................ 257/777
See application file for complete search history.

(56) References Cited

U.S. PATENT DOCUMENTS

| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2009/0052218 | A1* | 2/2009 | Kang ...................... H01L 25/18 365/51 |
| 2021/0375741 | A1* | 12/2021 | Tsou ................... H01L 23/3128 |

* cited by examiner

*Primary Examiner* — Theresa T Doan
(74) *Attorney, Agent, or Firm* — Birch, Stewart, Kolasch & Birch, LLP

(57) ABSTRACT

Semiconductor devices are provided. First and second dies are vertically stacked. The first die includes a plurality of memory cells and a plurality of first and second connection features. The memory cells are arranged in rows and columns of a memory array. The first connection features are electrically connected to a plurality of word lines of the memory array. The second connection features are electrically connected to a plurality of bit lines of the memory array. Each third connection feature of the second die is electrically connected to a respective first connection feature. Each word line driver of the second die is electrically connected to a respective third connection feature. Each fourth connection feature of the second die is electrically connected to a respective second connection feature of the first die. Each sense amplifier of the second die is electrically connected to a respective fourth connection feature.

20 Claims, 11 Drawing Sheets

SEMICONDUCTOR DEVICE WITH STACKED MEMORY PERIPHERY AND ARRAY AND METHOD FOR FORMING THE SAME

CROSS REFERENCE TO RELATED APPLICATIONS

This application claims priority to U.S. Provisional Application No. 63/419,074, filed on Oct. 25, 2022, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Memories are commonly used in integrated circuits. Memory is indispensable for most modern electronic equipment, such as computers, personal digital assistants, cellular telephones and digital cameras. A memory device is widely used to retain computer programs or video/audio data. Therefore, increasing memory capacity requirements within semiconductor devices manufactured is desired.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
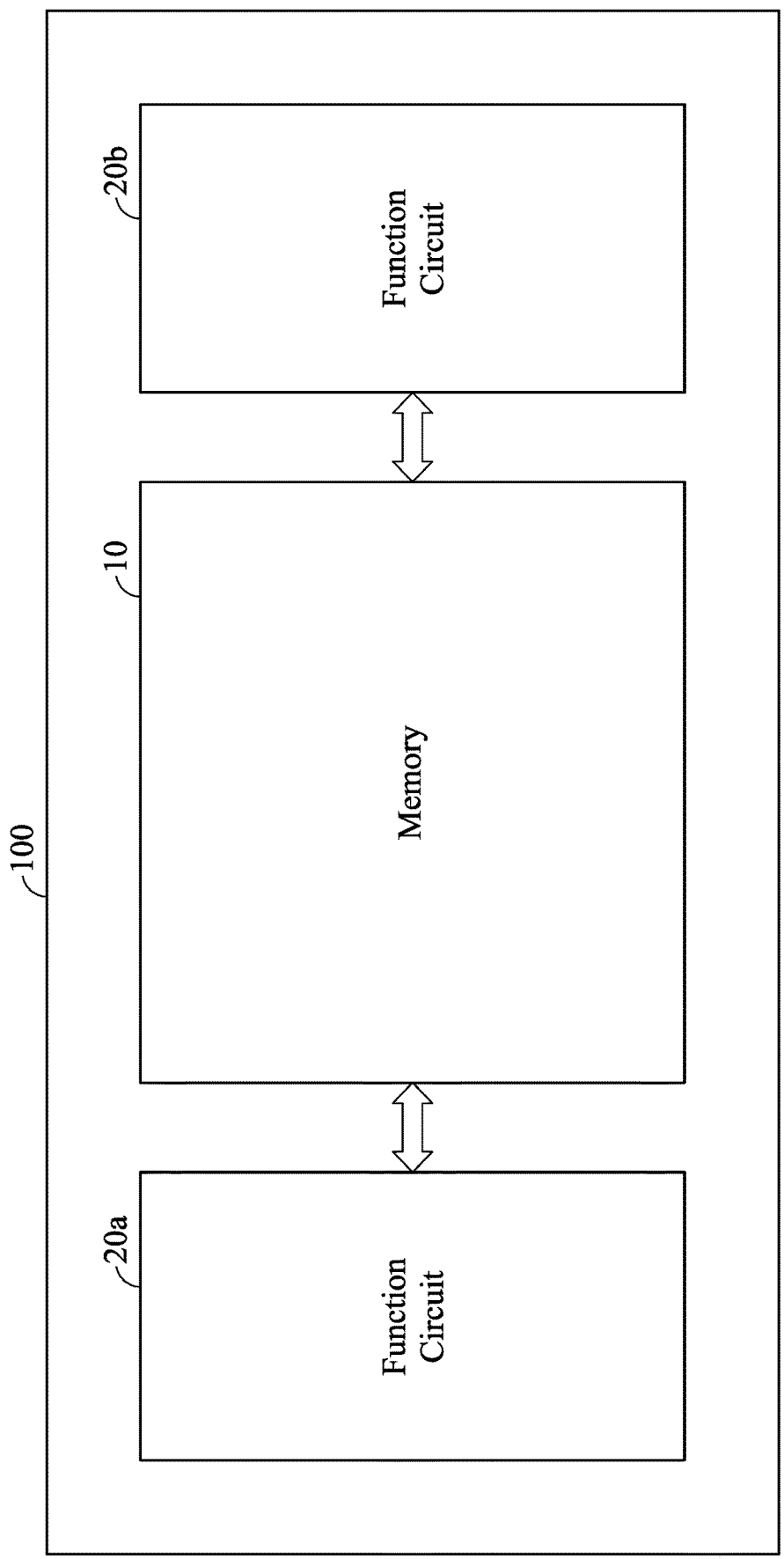
FIG. 1 shows a block diagram illustrating a semiconductor device, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely a packaging technique with an interposer substrate or other active chip in a three dimensional IC (3DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 shows a block diagram illustrating a semiconductor device 100, in accordance with some embodiments of the disclosure. The semiconductor device 100 is an integrated circuit (IC), and the IC includes a memory 10 and multiple function circuits 20a and 20b. The function circuits 20a and 20b are capable of accessing the memory 10 to perform various functions (or applications) or specific functions. In some embodiments, the semiconductor device 100 is a system-on-a-chip (SoC), ASIC, FPGA, and the function circuits 20a and 20b may be central processing unit (CPU), graphics processing unit (GPU), digital signal processing (DSP), application processor (AP), microcontroller, and so on. The memory 10 have multiple memory cells including, and not limited to, Static Random Access Memory (SRAM) cells, Dynamic Random Access Memory (DRAM) Cells, Magneto-Resistive Random Access Memory (MRAM) cells, or the like.

In FIG. 1, the function circuit 20a may be a controller (e.g., a processor, a CPU and so on) for controlling the various operations of the semiconductor device 100. The function circuit 20b may be a graphics processing unit (GPU) that is a circuit designed to manipulate and alter memory to accelerate the creation of images. The function circuits 20a and 20b are used as an example to illustrate simple schematic diagram, and is not meant to limit the disclosure. The semiconductor device 100 can include more function circuits to perform various applications.

Figure 2:
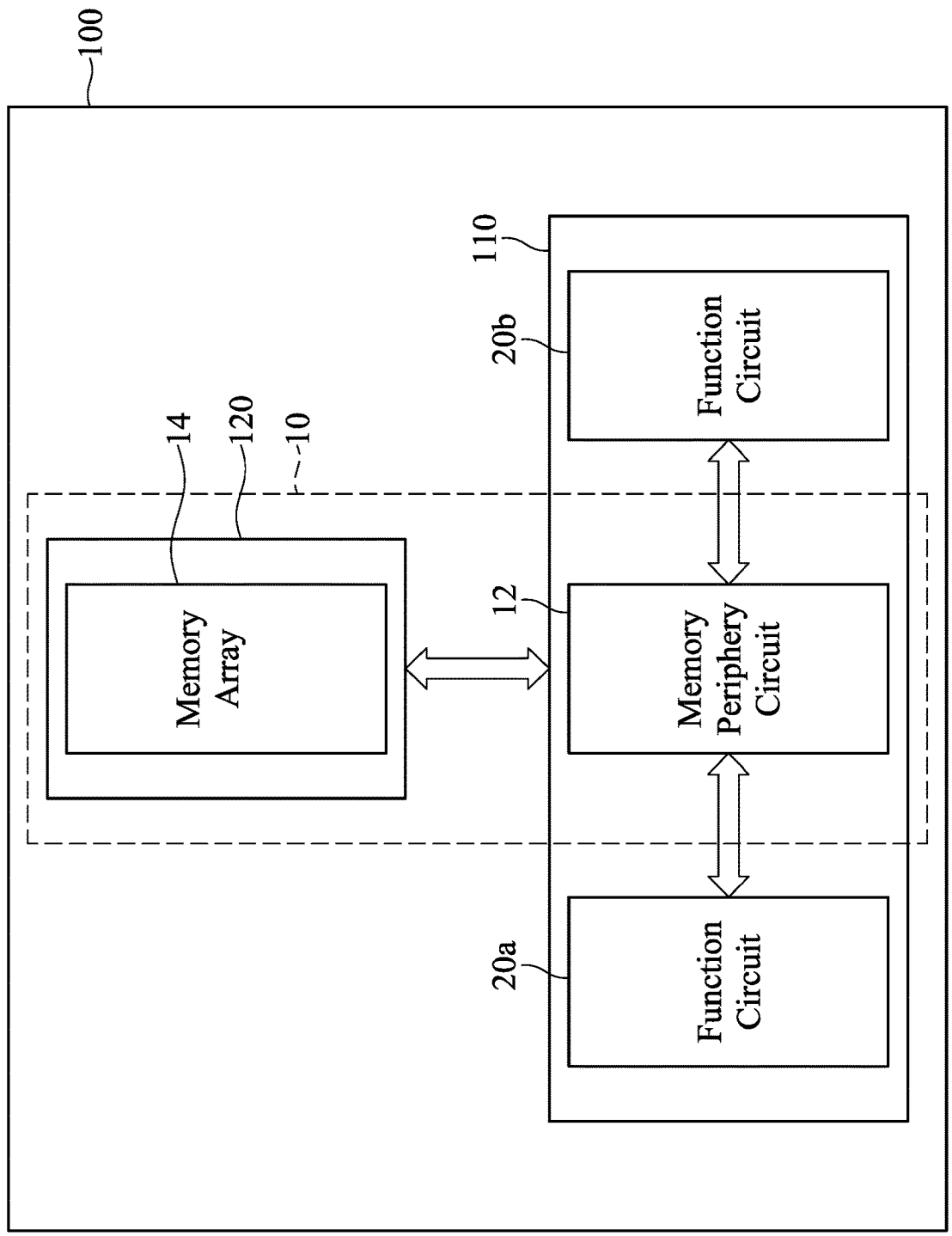
FIG. 2 shows a die configuration of the semiconductor device in FIG. 1, in accordance with some embodiments of the disclosure.

FIG. 2 shows a block diagram illustrating the dies 110 and 120 of the semiconductor device 100 in FIG. 1, in accordance with some embodiments of the disclosure. The semiconductor device 100 has a stack package structure formed by the dies 110 and 120. In some embodiments, the die 110 is vertically stacked over the die 120. In some embodiments, the die 110 is vertically stacked below the die 120.

The die 110 includes the function circuits 20a and 20b and a memory periphery circuit 12 of the memory 10. The die 120 includes a memory array 14 of the memory 10. In such embodiments, the memory 10 is implemented in the memory array 14 of the die 120 and the memory periphery circuit 12 of the die 110. In other words, the dies 110 and 120 are configured to perform the memory operation together for the memory 10.

Many applications require data to be stored in a non-volatile medium in order to fulfill the goal of portability. An example of non-volatile memory devices is flash memory, which is capable of retaining data when power is turned off. Flash memory is more competitive than conventional compact disks or magnetic-type recording media due to its light weight, superior recoding density, small form factor and shrinking cost. Flash memory has found many applications in the area of sensitive data access such as personal identity cards, healthcare cards, credit cards and electric wallets, and has widely replaced conventional paper or magnetic cards.

A SRAM is a volatile memory, and is used for electronic applications where high speed, low power consumption and simple operations are applicable. Embedded SRAM is particularly popular in high-speed communications, image processing, and system on chip (SOC) applications. SRAM has the advantageous feature of being able to hold data without requiring a refresh.

In the semiconductor device 100, the memory 10 is a SRAM. The memory array 14 is an array formed by the memory cells disposed in rows and columns. Each memory cell is a bit cell, as a six-transistor (6T), 8T, 10T cell and so on. Each memory cell includes the transistors coupled to bit lines (BLs) and word lines (WLs) that are used to read from of the memory cell and write a bit of data to the memory cell.

Figure 3A:
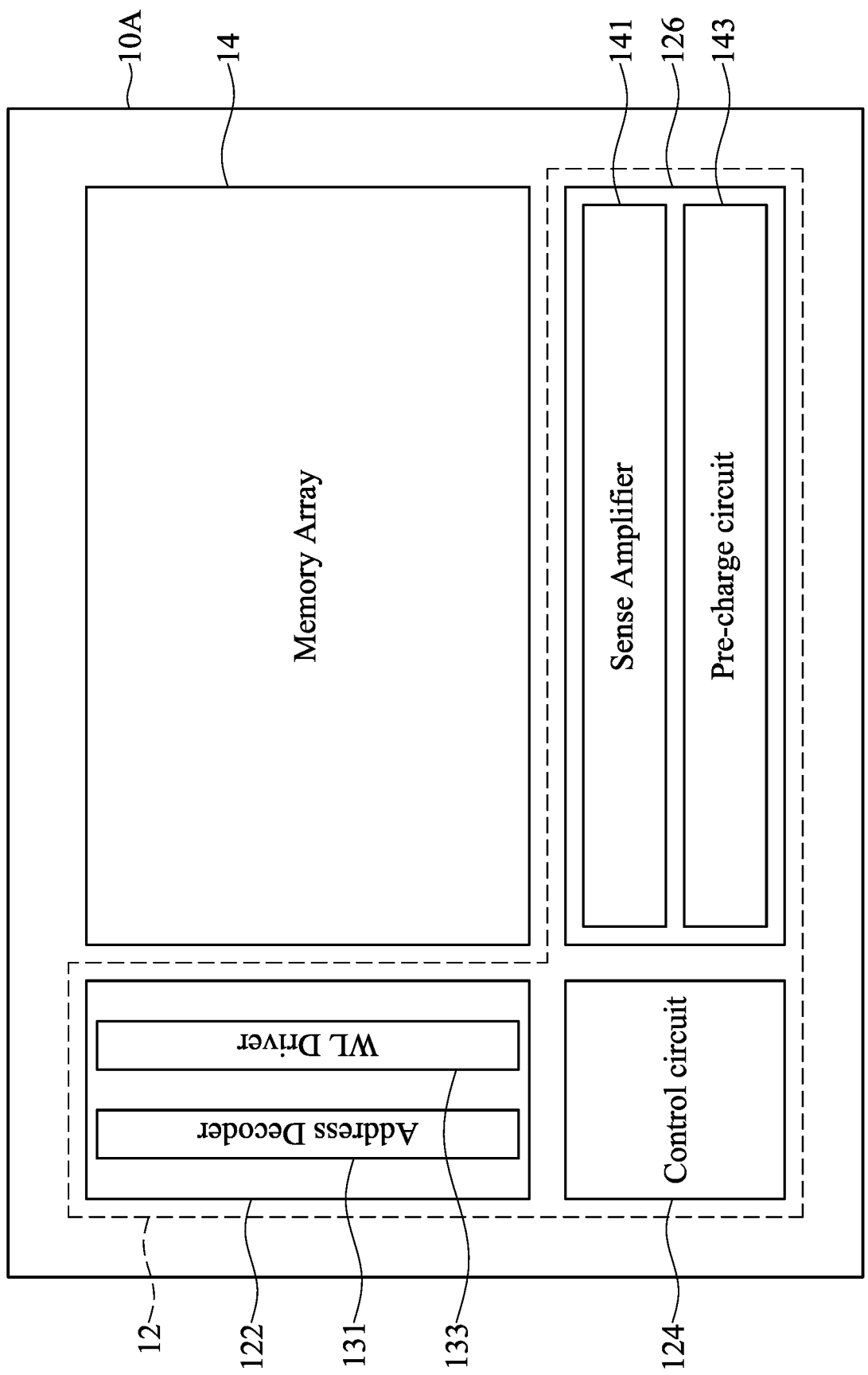
FIG. 3A shows a block diagram illustrating a memory of the semiconductor device of FIG. 1, in accordance with some embodiments of the disclosure

FIG. 3A shows a block diagram illustrating a memory 10A of the semiconductor device 100 of FIG. 1, in accordance with some embodiments of the disclosure. The memory 10A includes the memory periphery circuit 12 and the memory array 14. The memory periphery circuit 12 includes a decoder and word line (WL) driver 122, a control (CTRL) circuit 124, and data input/output (I/O) circuit 126. The control circuit 124 is configured to control the decoder and WL driver 122 and the data I/O circuit 126 in response to access requests from the other circuits (e.g., the function circuits 20a and 20b of FIG. 1).

The decoder and WL driver 122 includes an address decoder 131 and a WL driver circuit 133. The address decoder 131 is a row decoder, and configured to receive an access address from the control circuit and to obtain a row address for the memory array 14. The row address is configured to enable one of the word lines, so as to select the memory cells corresponding to said word line for read/write operations. In some embodiments, the address decoder 131 is configured to use combinations of logic 1's and 0's on the access address to choose a unique address (i.e., the row address) for the memory array 14. The WL driver circuit 133 includes multiple WL drivers. Each WL driver is configured to drive the corresponding word line. Thus, the memory cells corresponding to the driven word line are accessed for read/write operations.

The data I/O circuit 126 includes a sense amplifier circuit 141 and a pre-charge circuit 143. Furthermore, the data I/O circuit 126 further includes a write driver circuit. In some embodiments, the data I/O circuit 126 further includes a column multiplexer (decoder or selector). For simplicity of illustration, the column multiplexer and the write driver circuit are not shown in the data I/O circuit 126. The column multiplexer is configured to receive column address from the control circuit 124 and enables one of the columns in the memory array 14 for read/write operations. The write driver circuit connects directly to the bit lines of the memory array 14, and is configured to write a value to the SRAM cell corresponding to the row address. The pre-charge circuit 143 is configured to pre-charge all bit lines of the memory array 14 to logic level "1" before a read/write operation is performed. The sense amplifier circuit 141 includes multiple sense amplifiers, and each sense amplifier is electrically connected to the corresponding column of the memory array 14, so as to amplify small voltage swings of a pair of bit lines (i.e., a bit line and a complementary bit line) to recognizable logic levels ("1" or "0"), so that data can be read properly from the memory cell. In some embodiments, each sense amplifier is in charge of detecting what value is stored in the corresponding memory cell during a read cycle.

Figure 3B:
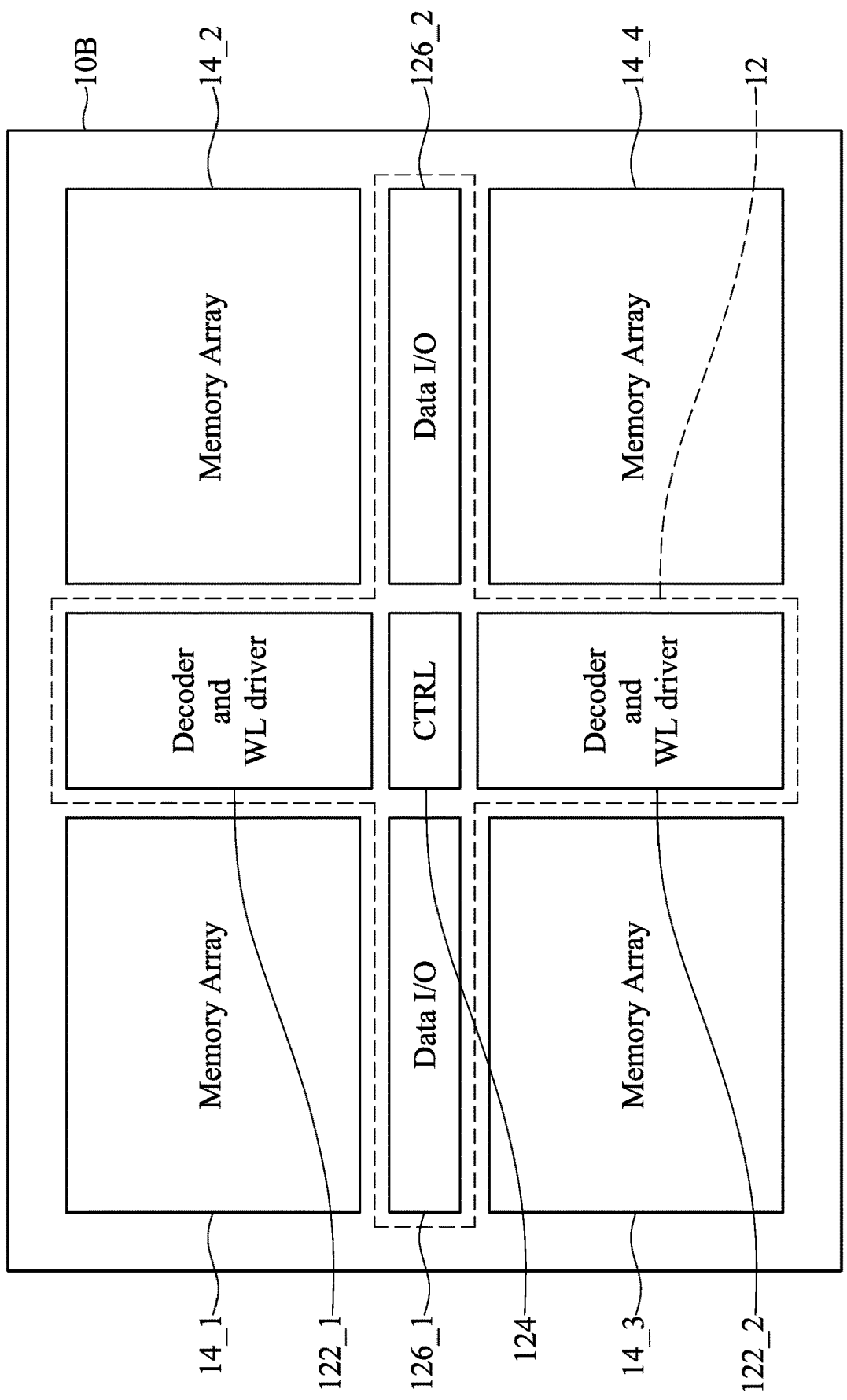
FIG. 3B shows a block diagram illustrating a memory of the semiconductor device of FIG. 1, in accordance with some embodiments of the disclosure.

FIG. 3B shows a block diagram illustrating a memory 10B of the semiconductor device 100 of FIG. 1, in accordance with some embodiments of the disclosure. The memory 10B includes the memory periphery circuit 12 and the memory arrays 14_1, 14_2, 14_3 and 14_4. The memory periphery circuit 12 includes the decoder and WL driver 122_1, the decoder and WL driver 122_2, the control circuit 124, the data input/output circuit 126_1 and the data input/output circuit 126_2. The control circuit 124 is configured to control the decoder and WL driver 122_1 and 122_2 and the data I/O circuits 126_1 and 126_2 in response to access requests from the other circuits (e.g., the function circuits 20a and 20b of FIG. 1). In some embodiments, the memory arrays 14_1, 14_2, 14_3 and 14_4 are arranged in the same die 120. In some embodiments, the memory arrays 14_1, 14_2, 14_3 and 14_4 are arranged in the different dies 120.

The decoder and WL driver 122_1 is configured to receive an access address from the control circuit 124 and to obtain a row address for the memory arrays 14_1 and 14_2. The row address form the decoder and WL driver 122_1 is configured to enable one of the word lines, so as to select the memory cells 30 in memory arrays 14_1 and 14_2 for read/write operations. The decoder and WL driver 122_2 is configured to receive an access address from the control circuit 124 and to obtain a row address for the memory arrays 14_3 and 14_4. The row address form the decoder and WL driver 122_2 is configured to enable one of the word lines, so as to select the memory cells 30 in memory arrays 14_3 and 14_4 for read/write operations. In the memory 10B, the decoder and WL driver 122_1 is shared by the memory arrays 14_1 and 14_2, and the decoder and WL driver 122_2 is shared by the memory arrays 14_3 and 14_4.

The data I/O circuit 126_1 is configured to receive column address from the control circuit 124 and enables one of the columns in the memory arrays 14_1 and 14_3 for read/write operations. The data I/O circuit 126_2 is configured to receive column address from the control circuit 124 and enables one of the columns in the memory arrays 14_2 and 14_4 for read/write operations. In the memory 10B, the data I/O circuit 126_1 is shared by the memory arrays 14_1 and 14_3, and the d data I/O circuit 126_2 is shared by the memory arrays 14_2 and 14_4.

Figure 4:
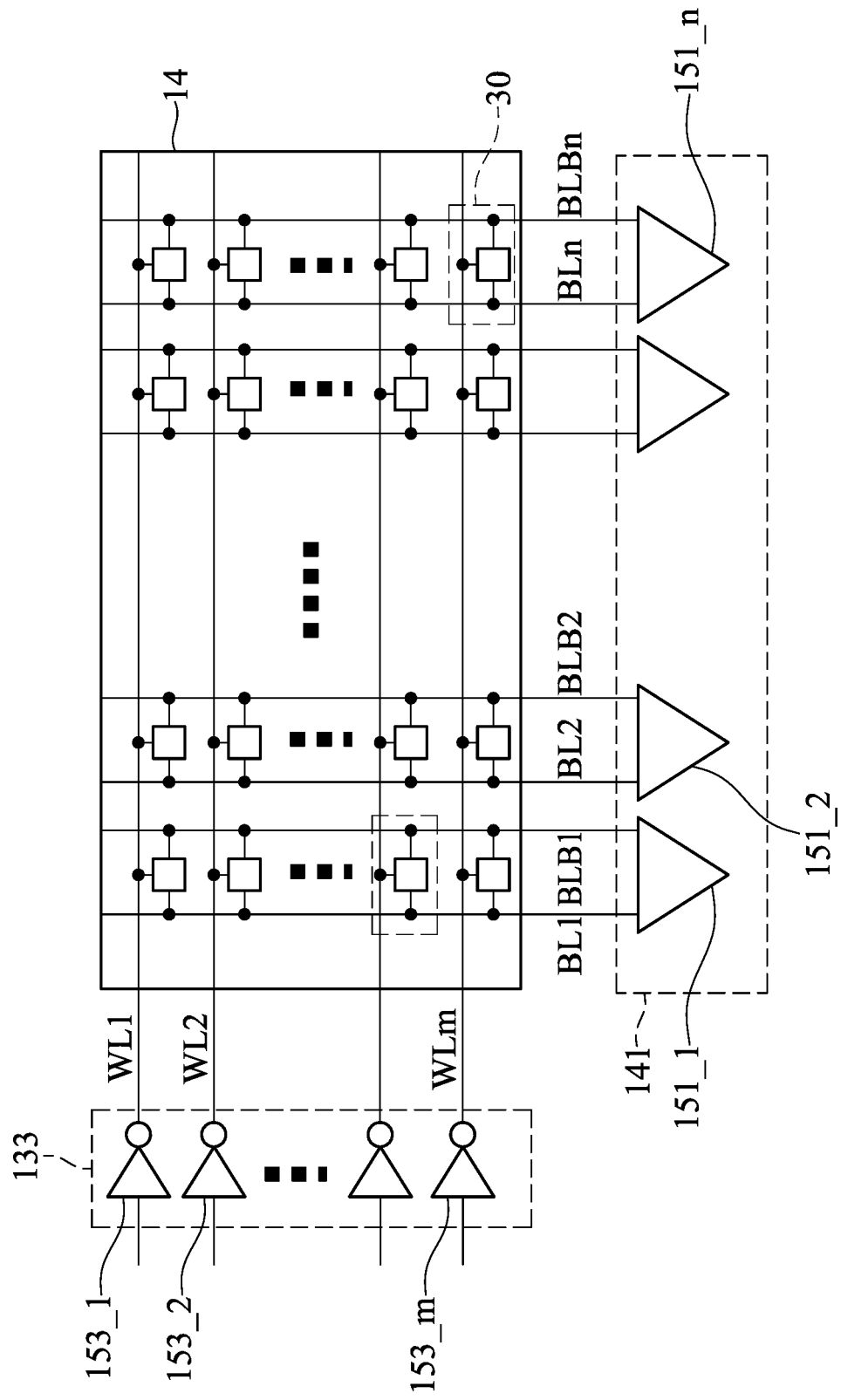
FIG. 4 shows a connection configuration of the memory array, the WL driver circuit and the sense amplifier circuit of the memory, in accordance with some embodiments of the disclosure.

FIG. 4 shows a connection configuration between the memory array 14, the WL driver circuit 133 and the sense amplifier circuit 141 of the memory 10, in accordance with some embodiments of the disclosure. The memory array 14 includes multiple memory cells 30 arranged in m rows and n columns. In the memory array 14, each column has the same number of memory cells 30, i.e., m memory cells 30 in each column. Furthermore, each row has the same number of memory cells 30, i.e., n memory cells 30 in each row.

The WL driver circuit 133 includes the WL drivers 153_1 through 153_m configured to drive the word lines WL1 through WLm. Each word line is driven by a corresponding WL driver, so as to control the memory cells 30 in the row corresponding to the word line. For example, the word line WL1 is driven by the WL driver 153_1, and the word line WL1 is electrically connected to the memory cells 30 in a first row. The word line WL2 is driven by the WL driver 153_2, and the word line WL2 is electrically connected to the memory cells 30 in a second row. The word line WLm is driven by the WL driver 153_m, and the word line WLm is electrically connected to the memory cells 30 in the last row.

The sense amplifier circuit 141 includes the sense amplifiers 151_1 through 151_n. Each sense amplifier is electrically connected to the corresponding column of the memory array 14. For example, the sense amplifier 151_1 is electrically connected to the memory cells 30 in a first column through a bit line BL1 and a complementary bit line BLB1 (i.e., a first pair of bit lines), and the complementary bit line BLB1 is complementary to the bit line BL1. The sense amplifier 151_1 is configured to amplify small voltage between the bit line BL1 and the complementary bit line BLB1. Moreover, the sense amplifier 151_2 is electrically connected to the memory cells 30 in a second column through a bit line BL2 and a complementary bit line BLB2 (i.e., a second pair of bit lines), and the sense amplifier 151_n is electrically connected to the memory cells 30 in the $n^{th}$ column through a bit line BLn and a complementary bit line BLBn (i.e., the last pair of bit lines).

Figure 5:
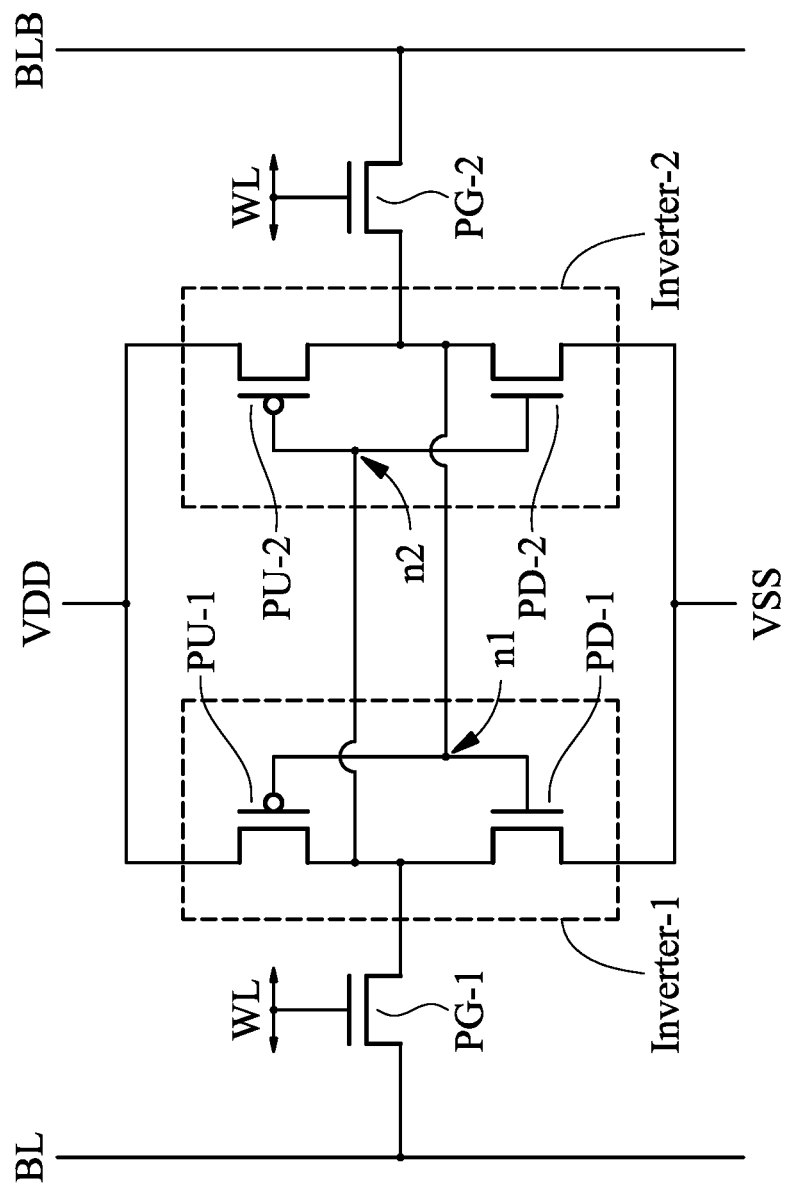
FIG. 5 shows the memory cell, in accordance with some embodiments of the disclosure.

FIG. 5 shows the memory cell 30, in accordance with some embodiments of the disclosure. In such embodiments, the memory cell 30 is a single-port SRAM bit cell. The memory cell 30 includes a pair of cross-coupled inverters Inverter-1 and Inverter-2, and two pass-gate transistors PG-1 and PG-2. The inverters Inverter-1 and Inverter-2 are cross-coupled between the nodes n2 and n1, and form a latch. The pass-gate transistor PG-1 is coupled between a bit line BL and the node n2, and the pass-gate transistor PG-2 is coupled between a complementary bit line BLB and the node n1. The gates of the pass-gate transistors PG-1 and PG-2 are coupled to the same word-line WL. Furthermore, the pass-gate transistors PG-1 and PG-2 are N-type transistors.

The inverter Inverter-1 includes a pull-up transistor PU-1 and a pull-down transistor PD-1. The pull-up transistor PU-1 is a P-type transistor, and the pull-down transistor PD-1 is an N-type transistor. The drain of the pull-up transistor PU-1 and the drain of the pull-down transistor PD-1 are coupled to the node n2 connecting the pass-gate transistor PG-1. The gates of the pull-up transistor PU-1 and the pull-down transistor PD-1 are coupled to the node n1 connecting the pass-gate transistor PG-2. Furthermore, the source of the pull-up transistor PU-1 is coupled to the power supply VDD, and the source of the pull-down transistor PD-1 is coupled to a ground VSS.

Similarly, the inverter Inverter-2 includes a pull-up transistor PU-2 and a pull-down transistor PD-2. The pull-up transistor PU-2 is a P-type transistor, and the pull-down transistor PD-2 is an N-type transistor. The drains of the pull-up transistor PU-2 and the pull-down transistor PD-2 are coupled to the node n1 connecting the pass-gate transistor PG-2. The gates of the pull-up transistor PU-2 and the pull-down transistor PD-2 are coupled to the node n2 connecting the pass gate transistor PG-1. Furthermore, the source of the pull-up transistor PU-2 is coupled to the power supply VDD, and the source of the pull-down transistor PD-2 is coupled to the ground VSS.

The P-type transistors and the N-type transistors of the memory cell 30 are formed by either FinFET transistor or vertically stacked gate-all-around (GAA) horizontal nanosheets transistors. The FinFET transistor may include single-fin or multiple fins. The GAA transistor may include single or multiple vertically stacked nano-sheet (or nano-wire, or fork-sheet).

Figure 6:
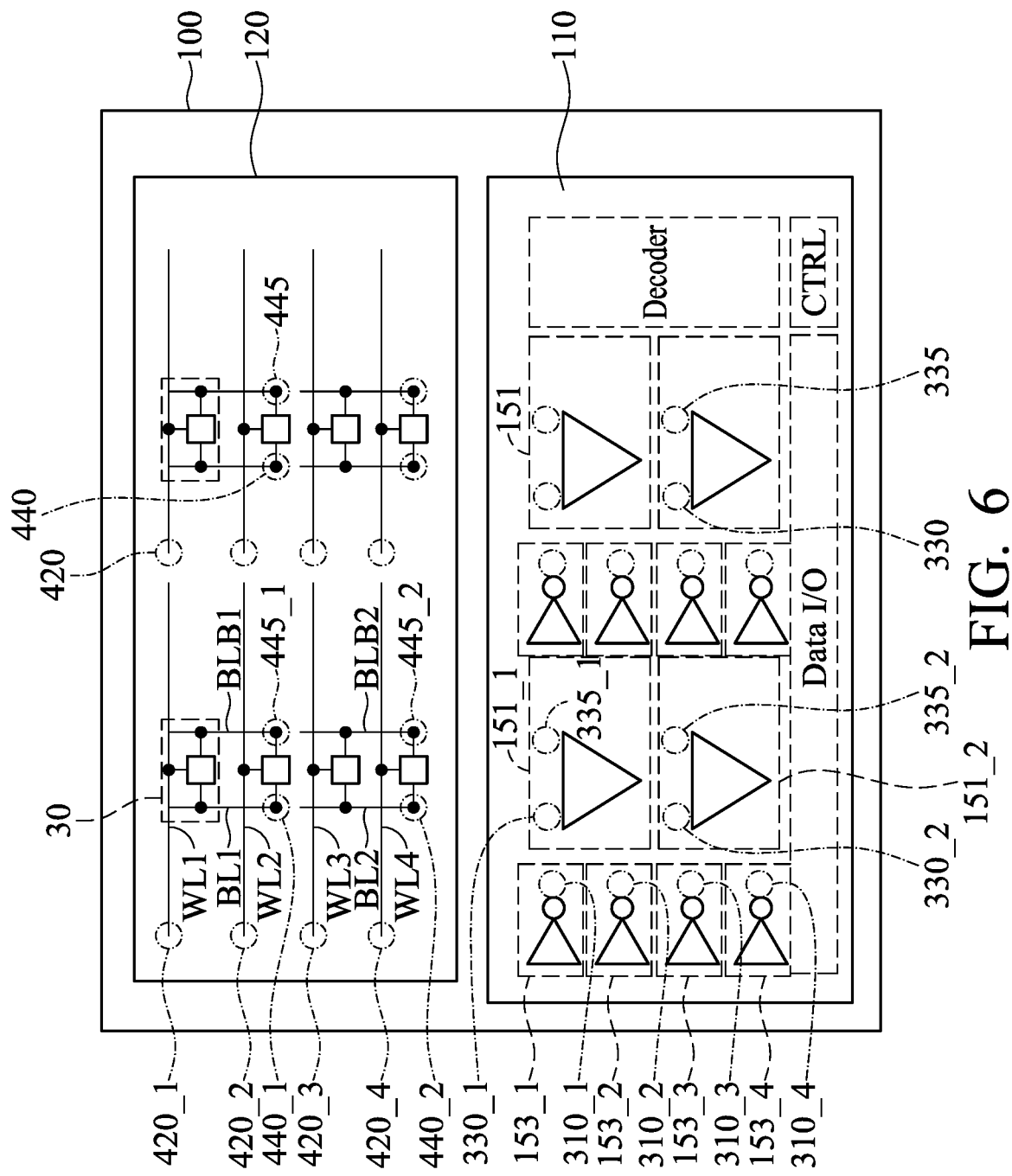
FIG. 6 shows a connection configuration of the dies of FIG. 2, in accordance with some embodiments of the disclosure.

FIG. 6 shows a connection configuration of the dies 110 and 120 of FIG. 2, in accordance with some embodiments of the disclosure. As described above, the die 110 is stacked over or below the die 120 in the semiconductor device 100. The die 110 includes the memory periphery circuit 12 that includes the WL drivers 153 and the sense amplifiers 151. In the die 110, each WL driver 153 is configured to provide a word line signal to the die 120 through respective connection feature 310 of the die 110 and respective connection feature 420 of the die 120. In other words, each WL driver 153 is electrically connected to the corresponding word line of the memory array 14 through the connection feature 310 of the die 110 and the connection feature 420 of the die 120.

In FIG. 6, the WL drivers 153_1, 153_2, 153_3 and 153_4 are configured to provide the word line signals to the word lines WL1, WL2, WL3 and WL4 of the memory array 14, respectively. For example, the WL driver 153_1 is electrically connected to the word line WL1 through the connection feature 310_1 of the die 110 and the connection feature 420_1 of the die 120. The WL driver 153_2 is electrically connected to the word line WL2 through the connection feature 310_2 of the die 110 and the connection feature 420_2 of the die 120. The WL driver 153_3 is electrically connected to the word line WL3 through the connection feature 310_3 of the die 110 and the connection feature 420_3 of the die 120. The WL driver 153_4 is electrically connected to the word line WL4 through the connection feature 310_4 of the die 110 and the connection feature 420_4 of the die 120.

In FIG. 6, each sense amplifier 151 is electrically connected to a respective bit line of the memory array 14 through the connection feature 330 of the die 110 and the connection feature 440 of the die 120. Similarly, each sense amplifier 151 is electrically connected to a respective complementary bit line of the memory array 14 through the connection feature 335 of the die 110 and the connection feature 445 of the die 120. For example, each of the sense amplifiers 151_1 and 151_2 has a first input terminal and a second input terminal. The first input terminal of the sense amplifier 151_1 is electrically connected to the bit line BL1 through the connection feature 330_1 of the die 110 and the connection feature 440_1 of the die 120, and the second input terminal of the sense amplifier 151_1 is electrically connected to the complementary bit line BLB1 through the connection feature 335_1 of the die 110 and the connection feature 445_1 of the die 120. Similarly, the first input terminal of the sense amplifier 151_2 is electrically connected to the bit line BL2 through the connection feature 330_2 of the die 110 and the connection feature 440_2 of the die 120, and the second input terminal of the sense amplifier 151_2 is electrically connected to the complementary bit line BLB2 through the connection feature 335_2 of the die 110 and the connection feature 445_2 of the die 120.

In some embodiments, the connection features 420, 440 and 445 of the die 120 and the connection features 310, 330 and 335 of the die 110 may be the bonding pads and/or the through silicon vias (TSVs). Furthermore, the number of the connection features in the dies 110 and 120 is only an example and is not intended to limit the disclosure.

In some embodiments, additional WL drivers 153 with the corresponding connection features 310 and additional sense amplifiers 151 with the corresponding connection features 330 and 335 are used in die 110. Furthermore, each word line in the memory array 14 of the die is broken up into several shorter elements. For example, taking the word line WL1 as an example, the word line WL1 is coupled to 1024 memory cells 30 in the same row of the memory array 14. In some embodiments, the word line WL1 is divided into 4 sub-word lines and each sub-word line is configured to control the 256 memory cells 30, i.e., the memory cells 30 arranged in the same row are divided into 4 groups. Thus, the length of the word line WL1 is considerably shortened (i.e., the sub-word line is shorter than the word line WL1), thereby decreasing IR drop of the word line and power consumption of the memory array 14. Furthermore, each group in the same row is electrically connected to a respective additional WL driver 153 of the die. Similarly, by using the additional sense amplifiers 151, the lengths of the bit lines BL and the complementary bit lines BLB are decreased, thereby increasing the read margin for the memory array 14. In other words, the memory cells 30 in the same column are divided into multiple groups. Furthermore, each group in the same column is electrically connected to respective additional sense amplifiers 151 of the die 110.

In the die 110, each WL driver 153 is electrically connected to individually connection feature 310, and each sense amplifier 151 is electrically connected to individually connection features 330 and 335. Therefore, the number of WL drivers is equal to the number of the connection features 310, and the number of sense amplifiers 151 is equal to the number of the connection features 330 and the number of the connection features 335. Furthermore, each connection feature 310 of the die 110 is electrically connected to individually connection feature 410 of the die 120 for the corresponding word line (or the corresponding sub-word line) in the memory array 14. Each connection feature 330 of the die 110 is electrically connected to individually connection feature 440 of the die 120 for the corresponding bit line (or the corresponding sub-bit line) in the memory array 14. Each connection feature 335 of the die 110 is electrically connected to individually connection feature 445 of the die 120 for the corresponding complementary bit line BLB (or the corresponding complementary sub-bit line) in the memory array 14. Therefore, the connection features 310 of the die 110 and the connection features 420 of the die 120 have the same number. Similarly, the connection features 330 and 335 of the die 110 and the connection features 440 and 445 of the die 120 have the same number.

The semiconductor device 100 has a stack package structure formed by one or more dies 110 and one or more dies 120. In bonding technology, various methods have been developed to bond two package components (such as dies and/or wafers) together. The available bonding methods include fusion bonding, eutectic bonding, direct metal bonding, hybrid bonding, and the like. In fusion bonding, an oxide surface of a wafer is bonded to an oxide surface or a silicon surface of another wafer (nitride and SiCN-like materials are also utilized for fusion bonding). In eutectic bonding, two eutectic materials are placed together, and are applied with a high pressure and a high temperature. The eutectic materials are hence molten. When the melted eutectic materials are solidified, the dies and/or wafers are bonded together. In direct metal-to-metal bonding, two metal pads are pressed against each other at an elevated temperature, and the inter-diffusion of the metal pads causes the bonding of the metal pads. In the hybrid bonding, the metal pads of two dies and/or wafers are bonded to each other through direct metal-to-metal bonding, and an oxide surface of one of the two dies (or wafers) is bonded to an oxide surface or a silicon surface of the other die (or wafer) (can also use nitride or SiCN).

In the stack package structure of the semiconductor device 100, the dies 110 and 120 may be bonded in a face-to-face (F2F) stacking or face-to-back (F2B) stacking. In some embodiments, the bond pitches of the stack package structure are fixed (e.g., using tight pitch (for example, <200 nm)) from the topmost tier to the bottommost tier. In some embodiments, the bonding pitches of the stack package structure may be in a monotonically increasing order from the topmost tier to the bottommost tier, where the topmost bonding tier has the finest bond pitch and the bottommost bonding tier has the coarsest bond pitch.

Figure 7:
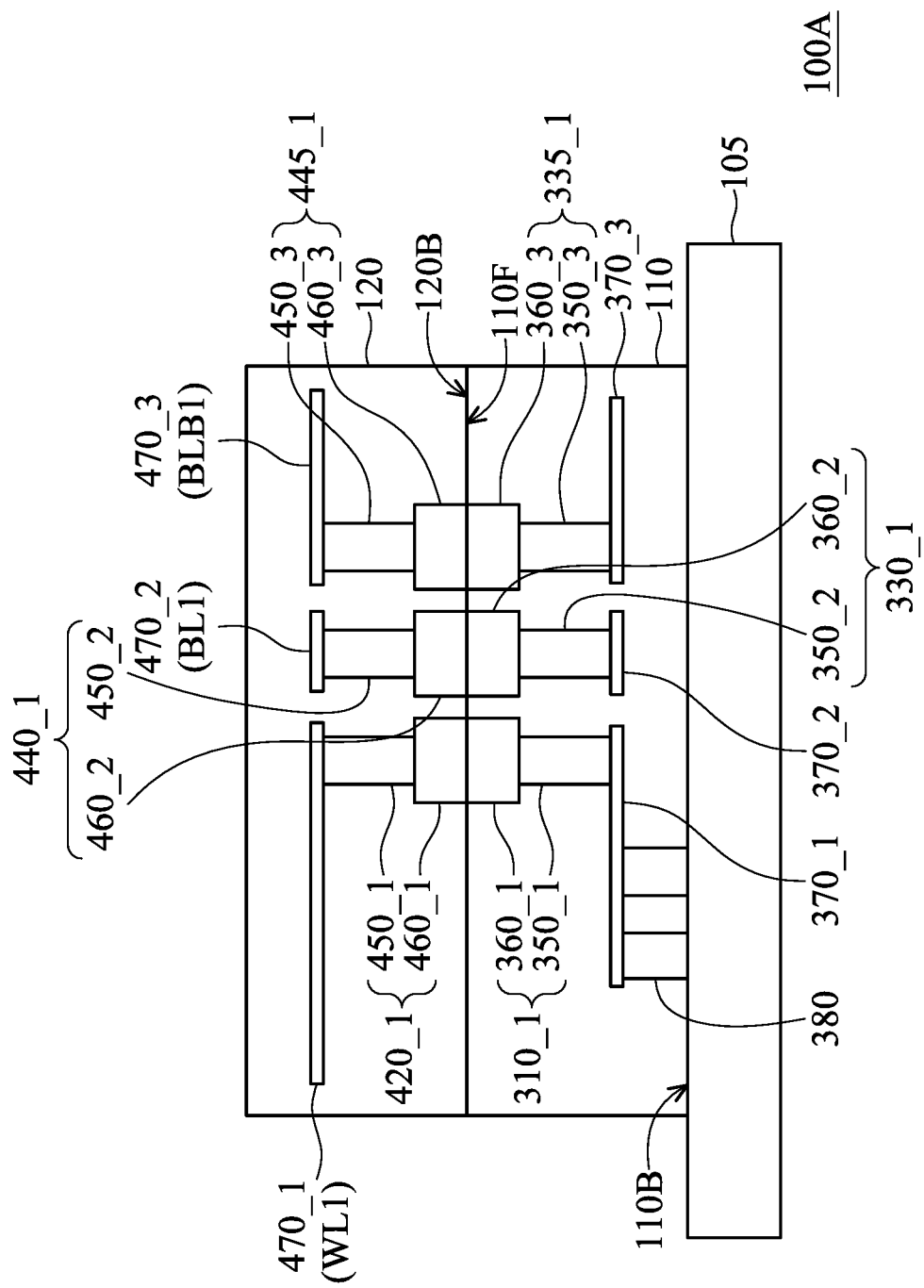
FIG. 7 shows a schematic illustrating the stack package structure of the semiconductor device, in accordance with some embodiments of the disclosure.

FIG. 7 shows a schematic illustrating the stack package structure of the semiconductor device 100A, in accordance with some embodiments of the disclosure. As shown in FIG. 7, the semiconductor device 100A includes a package substrate 105, a die 110 and a die 120. In order to simplify the description, the adhesive layer, the bonding film, the fill element, and the solder element are omitted in FIG. 7. It should be noted that additional features can be added to the stack package structure, and/or some of the features described below can be replaced or eliminated in other embodiments. Furthermore, the dies 110 and 120 are bonded together by the bonding method, and the bonding method is well known in the art and therefore not described herein.

The package substrate 105 may be used to provide electrical connection between components or devices packaged in the semiconductor package and an external electronic device (not shown). In some embodiments, the package substrate 105 is a bulk semiconductor substrate, a semiconductor-on-insulator (SOI) substrate, a germanium-on-insulator (GOI) substrate, or the like. The semiconductor substrate is formed of a elementary semiconductor such as silicon or germanium; a compound semiconductor such as silicon germanium, silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; or combinations thereof. Alternatively, the package substrate 105 may include a printed circuit board (PCB), a ceramic substrate, or another suitable package substrate, in accordance with some other embodiments. In some embodiments, the package substrate 105 may be a core or a core-less substrate.

In some embodiments, the package substrate 105 may has various device elements (not shown). Examples of device elements that are formed in or on the package substrate 105 may include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, resistors, capacitors, inductors, and/or other applicable device elements. Various processes can be performed to form the device elements, such as deposition, etching, implantation, photolithography, annealing, and/or other suitable processes. The package substrate 105 may also have one or more circuit layers (not shown) used to electrically connect the device elements and semiconductor devices that are subsequently attached.

In some embodiments, the package substrate 105 may be an interposer. The interposer may include an organic interposer substrate, a silicon interposer substrate, or the like. The interposer may also include conductive features therein, such as conductive lines and conductive vias (sometimes collectively referred to as a redistribution line (RDL) structure), to interconnect contact pads (not shown) exposed at opposite surfaces of the interposer. The materials and formation method of the interposer are well known in the art and therefore not described herein.

In the semiconductor device 100A, the dies 110 and 120 are bonded together in a face-to-face configuration, i.e., the top surface 110F of the die 110 faces and is in direct contact with the top surface 120F of the die 120. In such embodiments, the die 110 is the bottom die and the die 120 is the top die. Furthermore, the vertical projection of the die 120 overlaps the vertical projection of the die 110.

Referring to FIG. 6 and FIG. 7 together, in the die 110, the metal lines 370_1 through 370_3 are formed in the same metal layer. In some embodiments, the metal lines 370_1 through 370_3 are formed in the top metal layer of the die 110. In such embodiments, the metal line 370_1 is electrically connected to the WL driver 153_1, the metal line 370_2 is electrically connected to the first input terminal of the sense amplifiers 151_1, and the metal line 370_3 is electrically connected to the second input of the sense amplifiers 151_1. Furthermore, the metal line 370_1 is further electrically connected to the die 120 through the connection feature 310_1, and the connection feature 310_1 includes the via 350_1 and the bonding pad (e.g., the exposed contact pad) 360_1. The metal line 370_2 is further electrically connected to the die 120 through the connection feature 330_1, and the connection feature 330_1 includes the via 350_2 and the bonding pad 360_2. The metal line 370_3 is further electrically connected to the die 120 through the connection feature 335_1, and the connection feature 335_1 includes the via 350_3 and the bonding pad 360_3.

In the die 120, the metal lines 470_1 through 470_3 are formed in the same metal layer. In some embodiments, the metal lines 470_1 through 470_3 are formed in the top metal layer of the die 120. In such embodiments, the metal line 470_1 is electrically connected to the word line WL1 of the memory array 14, the metal line 470_2 is electrically connected to the bit line BL1 of the memory array 14, and the metal line 470_3 is electrically connected to the complementary bit line BLB1 of the memory array 14. Furthermore, the metal line 470_1 is further electrically connected to the connection feature 310_1 of the die 110 through the connection feature 420_1, and the connection feature 420_1 includes the via 450_1 and the bonding pad (e.g., the exposed contact pad) 460_1. The metal line 470_2 is further electrically connected to the connection feature 330_1 of the die 110 through the connection feature 440_1, and the connection feature 440_1 includes the via 450_2 and the bonding pad 460_2. The metal line 470_3 is further electrically connected to the connection feature 335_1 of the die 110 through the connection feature 445_1, and the connection feature 445_1 includes the via 450_3 and the bonding pad 460_3. After the dies 110 and 120 are bonded, the connection features 310_1, 330_1 and 335_1 are in contact with the connection features 420_1, 440_1 and 445_1, respectively.

In some embodiments, the die 110 further includes the TSV 380. The TSV 380 is exposed at the backside surface 110B of the die 110, so as to bond to the package substrate 105 in subsequent processing. As described above, the package substrate 105 may be an interposer, a die, or a wafer.

Figure 8:
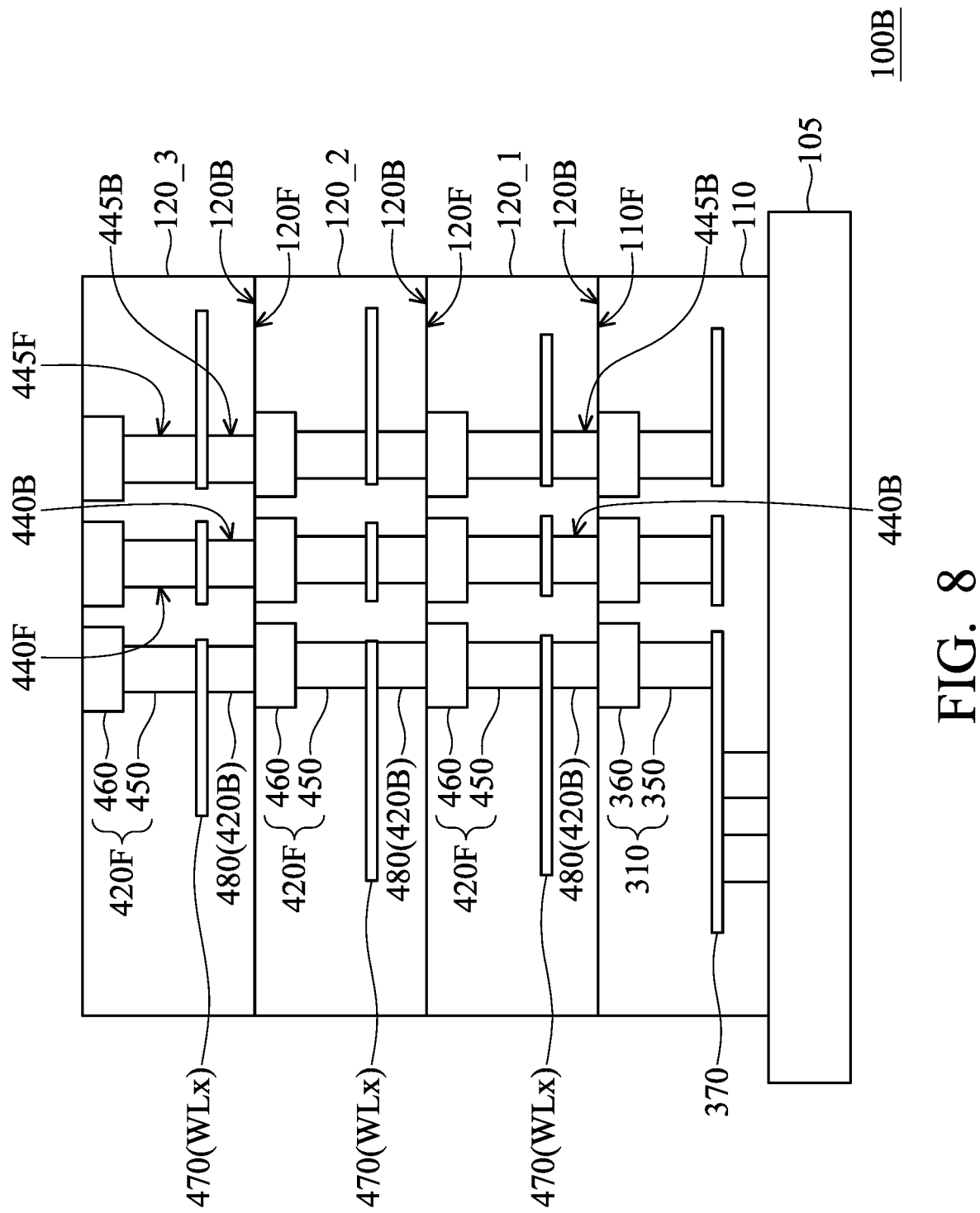
FIG. 8 shows a schematic illustrating the stack package structure of the semiconductor device, in accordance with some embodiments of the disclosure.

FIG. 8 shows a schematic illustrating the stack package structure of the semiconductor device 100B, in accordance with some embodiments of the disclosure. The semiconductor device 100B includes the package substrate 105, the die 110 and the dies 120_1, 120_2 and 120_3. Compared with the semiconductor device 100A of FIG. 7, the semiconductor device 100B has more dies 120 to provide more memory capacity.

In the semiconductor device 100B, the dies 110 and 120_1 are bonded together in a face-to-back configuration, i.e., the top surface 110F of the die 110 faces and is in direct contact with the backside surface 120B of the die 120_1. Similarly, the top surface 120F of the die 120_1 faces and is in direct contact with the backside surface 120B of the die 120_2, and the top surface 120F of the die 120_2 faces and is in direct contact with the backside surface 120B of the die 120_3. Furthermore, the vertical projection of the dies 120_1, 120_2 and 120_3 overlaps the vertical projection of the die 110.

In the semiconductor device 100B, the dies 120_1, 120_2 and 120_3 have the same configuration in the memory array 14. As described above, each connection feature 420 is configured to connect the respective word line in the die 120, each connection feature 440 is configured to connect the respective bit line in the die 120, and each connection feature 445 is configured to connect respective complementary bit line (or bit line bar) in the die 120. In FIG. 8, the connection feature 420 exposed at the backside surface 120B is labeled as 420B, and the connection feature 420 exposed at the top surface 120F is labeled as 420F. Similarly, the connection feature 440 exposed at the backside surface 120B is labeled as 440B, and the connection feature 440 exposed at the top surface 120F is labeled as 440F. The connection feature 445 exposed at the backside surface 120B is labeled as 445B, and the connection feature 445 exposed at the top surface 120F is labeled as 445F. In FIG. 8, each of the connection features 420F, 440F and 445F includes the via 450 and the bonding pad 460, and each of the connection features 420B, 440B and 445B includes the TSV 480.

In FIG. 8, taking the transmission of a word line signal as an example, the metal line 370 is electrically connected to the WL driver 153 in the die 110. Furthermore, the metal line 370 is further electrically connected to the dies 120_1, 120_2 and 120_3 through the corresponding connection features 420B and 420F. For example, the die 110 is configured to provide the word line signal to the corresponding word line WLx in the die 120_1 through the connection feature 420B of the die 120_1, and the connection feature 420B includes the TSV 480. Furthermore, the die 110 is configured to further provide the word line signal to the corresponding word line WLx in the die 120_2 through the die 120_1 (e.g., the connection feature 420B, the metal line 470, and the connection feature 420F of the die 120_1) and the connection feature 420B of the die 120_2. Furthermore, the die 110 is configured to further provide the word line signal to the corresponding word line WLx in the die 120_3 through the dies 120_1 and 120_2 and the connection feature 420B of the die 120.

Figure 9:
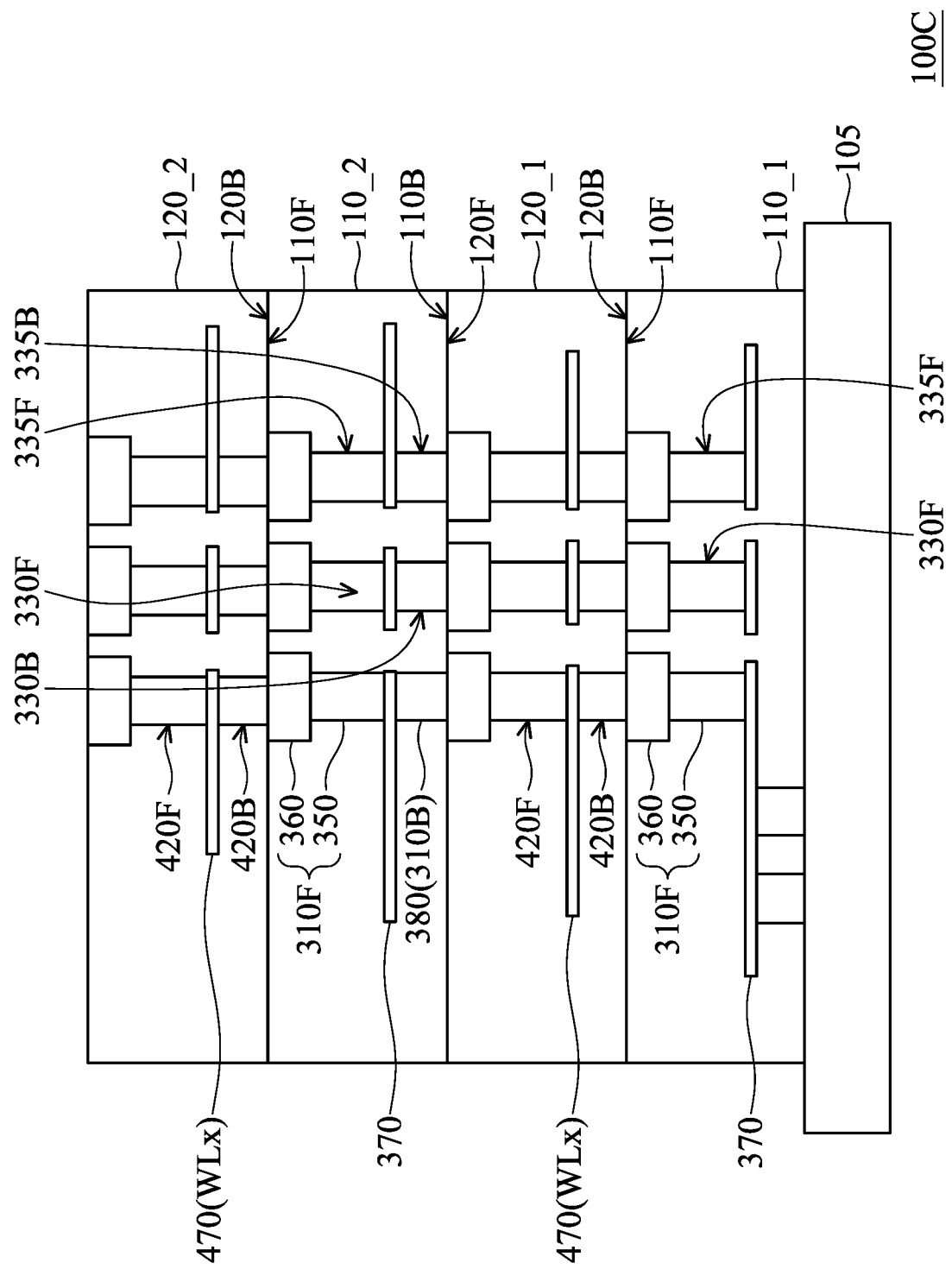
FIG. 9 shows a schematic illustrating the stack package structure of the semiconductor device, in accordance with some embodiments of the disclosure.

FIG. 9 shows a schematic illustrating the stack package structure of the semiconductor device 100C, in accordance with some embodiments of the disclosure. The semiconductor device 100C includes the package substrate 105, the dies 110_1 and 110_2 and the dies 120_1 and 120_2. Compare with the semiconductor device 100A of FIG. 7, the semiconductor device 100C has more dies 120 to provide more memory capacity, and the semiconductor device 100C has more dies 110 to provide more applications (e.g., the semiconductor device 100C has more function circuits 20 to perform various functions).

In the semiconductor device 100C, the dies 110 and 120_1 are bonded together in a face-to-back configuration, i.e., the top surface 110F of the die 110 faces and is in direct contact with the backside surface 120B of the die 120_1. Furthermore, the top surface 120F of the die 120_1 faces and is in direct contact with the backside surface 110B of the die 110_2, and the top surface 110F of the die 110_2 faces and is in direct contact with the backside surface 120B of the die 120_2. In other words, the dies 110 and the dies 120 are alternately stacked.

In FIG. 9, the connection feature 310 exposed at the backside surface 110B is labeled as 310B, and the connection feature 310 exposed at the top surface 110F is labeled as 310F. Similarly, the connection feature 330 exposed at the backside surface 110B is labeled as 330B, and the connection feature 330 exposed at the top surface 110F is labeled as 330F. The connection feature 335 exposed at the backside surface 110B is labeled as 335B, and the connection feature 335 exposed at the top surface 110F is labeled as 335F. In FIG. 9, each of the connection features 310F, 330F and 335F includes the via 350 and the bonding pad 360, and each of the connection features 310B, 330B and 335B includes the TSV 380.

Figure 10:
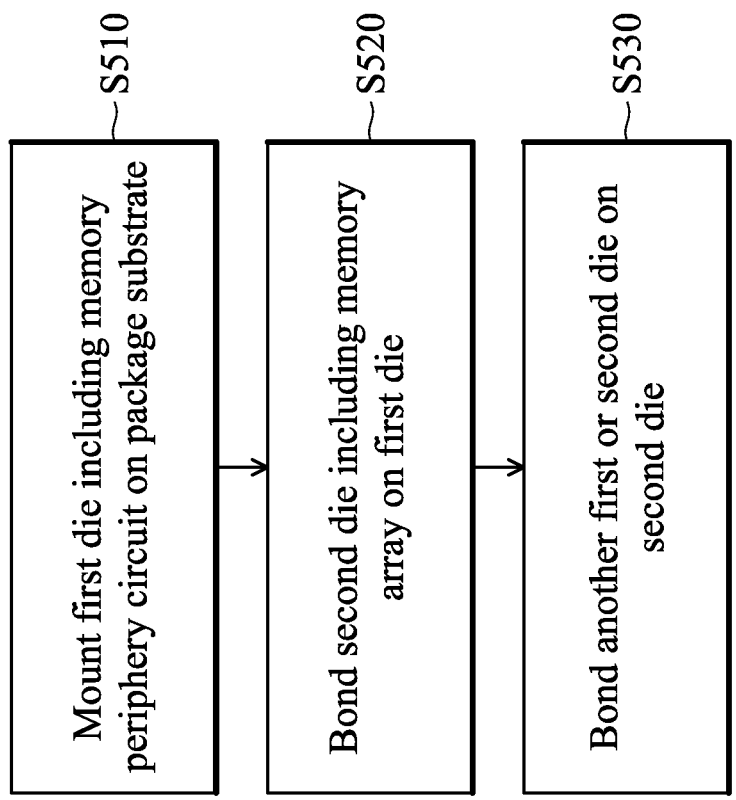
FIG. 10 shows a simplified flowchart illustrating a method for forming a semiconductor device, in accordance with some embodiments of the disclosure.

FIG. 10 shows a simplified flowchart illustrating a method for forming a semiconductor device, in accordance with some embodiments of the disclosure. In operation S510, the die 110 is mounted on the package substrate 105. In operation S520, the die 120 is bonded on the die 110, as shown in FIG. 7. In operation S530, another die 110 or 120 is bonded on the die 120, as shown in FIG. 8 or 9. In some embodiments, the dies 110 and 120 are bonded together in a face-to-face configuration. In some embodiments, the dies 110 and 120 are bonded together in a face-to-back configuration.

In some embodiments, operation S510 is not performed until operations S520 and S530 are completed. For example, the die 120 is bonded on the die 110 (operation S520) first, and then another die 110 or 120 is bonded on the die 120 (operation S530). Next, the die 110 is mounted on the package substrate 105 along with the die 120 and another die 110 or 120.

The die 110 includes the memory periphery circuit 12 and the die 120 includes the memory array 14. In other words, a memory periphery circuit of a memory is implemented in the die 110, and a memory array of the memory is implemented in the die 120. Therefore, no memory array 14 is implemented in the die 110 (i.e., the die 110 is free of any memory array), thereby decreasing the area of the die 110. Furthermore, by forming the memory array in the die 120, the memory cell density is increased because there is no need to consider the memory periphery circuit or other circuits in the die 120. Moreover, the memory array and the memory periphery circuit are formed in different dies, and the processes of the dies 110 and 120 can be adjusted separately for optimization, so as to improve yield.

Embodiments of semiconductor devices are provided. The semiconductor device has a stock package structure. In the semiconductor device, a memory periphery circuit and a memory array of a memory are implemented in different vertically stacked dies. The memory periphery circuit is implemented in the die 110 with the various function circuits, and the memory array is implemented in the die 120 without the function circuits and the memory periphery circuit. Therefore, by increasing the number of stacked dies 120, the memory capacity is increased for the semiconductor device 100.

In some embodiments, a semiconductor device is provided. The semiconductor device includes a first die and a second die under or over the first die. The first die includes a plurality of memory cells, a plurality of first connection features, a plurality of second connection features. The memory cells are arranged in a plurality of rows and a plurality of columns of a memory array. The first connection features are electrically connected to a plurality of word lines of the memory array. The second connection features are electrically connected to a plurality of bit lines of the memory array. The second die includes a plurality of third connection features, a plurality of word line drivers, a plurality of fourth connection features, and a plurality of sense amplifiers. Each third connection feature is electrically connected to a respective first connection feature of the first die. Each word line driver is electrically connected to a respective third connection feature. Each fourth connection feature is electrically connected to a respective second connection feature of the first die. Each sense amplifier is electrically connected to a respective fourth connection feature.

In some embodiments, a semiconductor device is provided. The semiconductor device includes a plurality of first dies vertically stacked and a second die stacked under at least one of the first dies. Each first die includes a plurality of memory cells, a plurality of first connection features, a plurality of second connection features. The memory cells are arranged in a plurality of rows and a plurality of columns of a memory array. The first connection features are electrically connected to a plurality of word lines of the memory array. The second connection features are electrically connected to a plurality of bit lines of the memory array. The second die includes a plurality of third connection features, a plurality of word line drivers, a plurality of fourth connection features, and a plurality of sense amplifiers. Each third connection feature is electrically connected to a respective first connection feature of each first die. Each word line driver is electrically connected to a respective third connection feature. Each fourth connection feature is electrically connected to a respective second connection feature of each first die. Each sense amplifier is electrically connected to a respective fourth connection feature.

In some embodiments, a method for forming a semiconductor device is provided. A first die is mounted on a package substrate. A second die is bonded on the first die. The vertical projection of the first die overlaps the vertical projection of the second die. The memory periphery circuit of a memory is implemented in the first die, and a memory array of the memory is implemented in the second die, and the memory periphery circuit is configured to access the memory array.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first die, comprising:
   a plurality of memory cells arranged in a plurality of rows and a plurality of columns of a memory array;
   a plurality of first connection features electrically connected to a plurality of word lines of the memory array; and
   a plurality of second connection features electrically connected to a plurality of bit lines of the memory array; and
   a second die under or over the first die, comprising:
   a plurality of third connection features, each electrically connected to a respective first connection feature of the first die;
   a plurality of word line drivers, each electrically connected to a respective third connection feature;
   a plurality of fourth connection features, each electrically connected to a respective second connection feature of the first die; and
   a plurality of sense amplifiers, each electrically connected to a respective fourth connection feature.

2. The semiconductor device as claimed in claim 1, wherein each of the word line drivers is configured to provide a word line signal to the memory cells arranged in one of the rows through the corresponding first connection feature and the corresponding third connection feature.

3. The semiconductor device as claimed in claim 1, wherein the memory cells arranged in the same row of the memory array are divided into a plurality of groups, and each of the groups is electrically connected to a respective word line.

4. The semiconductor device as claimed in claim 1, wherein the memory cells arranged in the same column of the memory array are divided into a plurality of groups, and each of the groups is electrically connected to a respective sense amplifier.

5. The semiconductor device as claimed in claim 1, further comprising:
   a package substrate,
   wherein the first die is formed over the package substrate, and the second die is formed over the first die,
   wherein a vertical projection of the first die overlaps a vertical projection of the second die.

6. The semiconductor device as claimed in claim 5, wherein each of the first and second connection features is exposed at a top surface of the first die, and each of the third and fourth connection features is exposed at a backside surface of the second die.

7. The semiconductor device as claimed in claim 6, wherein each of the first and second connection features comprises a bonding pad exposed at the top surface of the first die and a via electrically connected to the bonding pad, and each of the third and fourth connection features comprises a through silicon via exposed at the backside surface of the second die.

8. The semiconductor device as claimed in claim 1, further comprising:
   a package substrate,
   wherein the second die is formed over the package substrate, and the first die is formed over the second die,
   wherein a vertical projection of the first die overlaps a vertical projection of the second die.

9. The semiconductor device as claimed in claim 8, wherein each of the first and second connection features is exposed at a top surface of the first die, and each of the third and fourth connection features is exposed at a top surface of the second die.

10. The semiconductor device as claimed in claim 9, wherein each of the first and second connection features comprises a bonding pad exposed at the top surface of the first die and a via electrically connected to the bonding pad, each of the third connection features comprises a first bonding pad exposed at the top surface of the second die and a via between the word line driver and the first bonding pad, and each of the fourth connection features comprises a second bonding pad exposed at the top surface of the second die and a via between the sense amplifier and the second bonding pad.

11. The semiconductor device as claimed in claim 8, wherein each of the first and second connection features is exposed at a backside of the first die, and each of the third and fourth connection features is exposed at a top surface of the second die.

12. The semiconductor device as claimed in claim 11, wherein each of the first and second connection features comprises a through silicon via exposed at the backside surface of the first die, each of the third connection features comprises a first bonding pad exposed at the top surface of the second die and a via between the word line driver and the first bonding pad, and each of the fourth connection features comprises a second bonding pad exposed at the top surface of the second die and a via between the sense amplifier and the second bonding pad.

13. A semiconductor device, comprising:
a plurality of first dies vertically stacked, each comprising:
a plurality of memory cells arranged in a plurality of rows and a plurality of columns of a memory array;
a plurality of first connection features electrically connected to a plurality of word lines of the memory array; and
a plurality of second connection features electrically connected to a plurality of bit lines of the memory array; and
a second die stacked under at least one of the first dies, comprising:
a plurality of third connection features, each electrically connected to a respective first connection feature of each of the first dies;
a plurality of word line drivers, each electrically connected to a respective third connection feature;
a plurality of fourth connection features, each electrically connected to a respective second connection feature of each of the first dies; and
a plurality of sense amplifiers, each electrically connected to a respective fourth connection feature.

14. The semiconductor device as claimed in claim 13, wherein each of the word line drivers is configured to provide a word line signal to the memory cells arranged in one of the rows through the corresponding first connection feature of each of the first dies and the corresponding third connection feature.

15. The semiconductor device as claimed in claim 13, further comprising:
a package substrate,
wherein one of the first dies is formed over the package substrate, and the second die is formed between the one of the first dies and the remaining first dies,
wherein a vertical projection of the first dies overlap a vertical projection of the second die.

16. The semiconductor device as claimed in claim 15, wherein each of the first and second connection features of the one of the first dies is exposed at a top surface of the one of the first dies, and each of the third and fourth connection features is exposed at a backside surface of the second die.

17. The semiconductor device as claimed in claim 13, further comprising:
a package substrate,
wherein the second die is formed over the package substrate, and the first dies are formed over the second die,
wherein a vertical projection of the first dies overlap a vertical projection of the second die.

18. A semiconductor device, comprising:
a first die, comprising:
a plurality of memory cells arranged in a plurality of rows and a plurality of columns of a memory array;
a plurality of first connection features electrically connected to a plurality of word lines of the memory array; and
a plurality of second connection features electrically connected to a plurality of bit lines of the memory array; and
a second die under or over the first die, comprising:
a plurality of third connection features, each electrically connected to a respective first connection feature of the first die;
a plurality of word line drivers, each electrically connected to a respective third connection feature;
a plurality of fourth connection features, each electrically connected to a respective second connection feature of the first die; and
a plurality of sense amplifiers, each electrically connected to a respective fourth connection feature;
wherein a vertical projection of the first die overlaps a vertical projection of the second die,
wherein a memory periphery circuit of a memory is implemented in the first die, and a memory array of the memory is implemented in the second die,
wherein the memory periphery circuit is configured to access the memory array.

19. The semiconductor device as claimed in claim 18, wherein the first die is free of the memory array.

20. The semiconductor device as claimed in claim 18, wherein the first die and the second die are bonded together in a face-to-face or face-to-back configuration.

* * * * *